United States Patent

Wristers et al.

[11] Patent Number: 5,930,620
[45] Date of Patent: Jul. 27, 1999

[54] RESISTANCE TO GATE DIELECTRIC BREAKDOWN AT THE EDGES OF SHALLOW TRENCH ISOLATION STRUCTURES

[75] Inventors: Derrick J. Wristers, Austin; Mark I. Gardner, Cedar Creek; H. Jim Fulford, Austin, all of Tex.

[73] Assignee: Advanced Micro Devices

[21] Appl. No.: 08/928,619

[22] Filed: Sep. 12, 1997

[51] Int. Cl.$^6$ ............. H01L 21/8242; H01L 21/76; H01L 21/265; H01L 21/31; H01L 21/469

[52] U.S. Cl. ............. 438/243; 438/424; 438/520; 438/296; 438/770; 438/766; 438/981

[58] Field of Search ................. 438/766, 770, 438/296, 424, 981, 243, 520

[56] References Cited

U.S. PATENT DOCUMENTS 5,100,823  3/1992  Yamada .
5,183,775  2/1993  Levy .

OTHER PUBLICATIONS

Wolf et al., *Silicon Processing For The VLSI ERA,* vol. 1: Process Technology, 1986 Lattice Press, p. 183.
Sze, S.M., Semiconductor Devices Physics and Technology, John Wiley & Sons, pp. 362–363, 1985.

*Primary Examiner*—Richard A Booth
*Assistant Examiner*—Josetta Jones
*Attorney, Agent, or Firm*—Kevin L. Daffer; Conley, Rose & Tayon

[57] ABSTRACT

A semiconductor process in which at least one isolation structure is formed in a semiconductor substrate. An oxygen bearing species is introduced into portions of the semiconductor substrate proximal to the isolation structure. A gate dielectric layer is then formed on an upper surface of the semiconductor substrate. The presence of the oxygen bearing species in the proximal portions of the semiconductor substrate increases the oxidation rate of the portions relative to the oxidation rate of portions of the substrate that are distal to the isolation structures. In this manner, the first thickness of the gate dielectric over the proximal portions of the semiconductor substrate is greater than a second thickness of the gate oxide layer over remaining portions of the semiconductor substrate. The increased oxide thickness adjacent to the discontinuities of the isolation trench reduces the electric field across the oxide.

20 Claims, 2 Drawing Sheets

RESISTANCE TO GATE DIELECTRIC BREAKDOWN AT THE EDGES OF SHALLOW TRENCH ISOLATION STRUCTURES

BACKGROUND OF THE INVENTION

1. Field of the Invention

The present invention relates to the field of semiconductor processing and more particularly to a method of forming a variable thickness gate oxide to minimize the electric field at the isolation boundaries of the transistor.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 microns, the limitations of conventional transistor processing become more apparent. To combat short channel effects in deep sub-micron transistors, the depth of the source/drain junctions and the thickness of the gate oxides must be reduced. Devices become more susceptible, however, to breakdown due to electrical stress across the oxide. In a conventional sub-half-micron transistors, for example, gate dielectric thickness in the range of approximately 50 angstroms are not uncommon. If a 3.3 volt potential is applied across this film, a common occurrence in MOS transistors, the resulting electrical field has a nominal value in the range of approximately 3.3 MV/cm. In regions of the underlying gate dielectric proximate to geometric discontinuities, a localized electric field can greatly exceed the nominal value and can cause dielectric breakdown. Accordingly, it has been theorized that the gate dielectric is more likely to break down in regions of the device adjacent or proximal to isolation structures and, more particularly, shallow trench isolation structures, where discontinuities in the underlying substrate are common and can result in electrical fields exceeding 6 MV/cm, which is considered to be an upper limit on the electrical field sustainable by a thermally formed $SiO_2$ film. See, e.g., 1 S. Wolf & R. Tauber, *Silicon Processing for the VLSI Era* 183 (Lattice Press 1986) [hereinafter "Wolf Vol. 1"].

Despite the problem of dielectric breakdown, thin gate dielectrics are desirable in the active regions of a device because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit.

Therefore, it would be highly desirable to fabricate a gate dielectric that simultaneously possessed the requisite thinness in critical active regions of the device and an improved resistance to dielectric breakdown in regions of the device proximal to discontinuities in the dielectric.

SUMMARY OF THE INVENTION

The problems identified above are in large part addressed by a semiconductor process in which the semiconductor substrate is oxygenated in regions proximal to isolation structures to increase the oxidation rate of the underlying semiconductor substrate. A subsequently formed gate dielectric film can include a region of thicker oxide at the isolation edges. This thicker region of gate dielectric increases or enhances the reliability of the transistor by reducing the electric field in regions of the semiconductor substrate where the field strength is greatest.

Broadly speaking the present invention contemplates a semiconductor process in which at least one isolation structure is formed in a semiconductor substrate. An oxygen bearing species is introduced into portions of the semiconductor substrate proximal to the isolation structure. A gate dielectric layer is then formed on an upper surface of the semiconductor substrate. The presence of the oxygen bearing species in the proximal portions of the semiconductor substrate increases the oxidation rate of the portions relative to the oxidation rate of portions of the substrate that are distal to the isolation structures. In this manner, the first thickness of the gate dielectric over the proximal portions of the semiconductor substrate is greater than a second thickness of the gate oxide layer over remaining portions of the semiconductor substrate.

In one embodiment, the semiconductor substrate comprises a single crystal silicon wafer. Preferably, the silicon wafer includes a p-type epitaxial layer formed on a p+ silicon bulk. A preferred resistivity of the epitaxial layer is in the range of approximately 10 to 15 $\Omega$-cm. In a presently preferred embodiment, the formation of the isolation structure is accomplished by etching an isolation trench into an isolation region of the semiconductor substrate, filling the isolation trench with an isolation dielectric, and removing portions of the isolation dielectric exterior to the isolation trench. Preferably, the filling of the isolation trench comprises thermally decomposing TEOS in a plasma enhanced chemical vapor deposition reactor chamber maintained at a temperature in the range of approximately 650 to 750° C. In one embodiment, a thermal oxide layer is formed on exposed surfaces of the isolation trench prior to depositing TEOS. In this embodiment, the thermal oxide layer is preferably formed by immersing the semiconductor substrate in an oxygen bearing ambient maintained at a temperature in the range of approximately 500 to 900° C. The removal of portions of the isolation dielectric is preferably accomplished by planarizing the isolation dielectric with a chemical mechanical polish.

The introduction of the oxygen bearing species into the semiconductor substrate is preferably accomplished by forming a patterned mask over an upper surface of the semiconductor substrate. The patterned mask exposes regions of the substrate that are proximal to the isolation structure. The oxygen species is then implanted into the semiconductor substrate. The patterned mask substantially prevents the oxygen species from entering the distal portions of the semiconductor substrate. A suitable implant energy for the ion implantation is in the range of approximately 10 to 50 keV and a suitable implant dose is in the range of approximately $1 \times 10^{14}$ to $5 \times 10^{15}$ atoms/cm$^2$.

The proximal portions of the semiconductor substrate, in one embodiment comprise those portions of the semiconductor substrate within approximately 200 angstroms of the isolation structure. In one embodiment, the present invention further includes the formation of a conductive gate structure on an upper surface of the semiconductor substrate. In this embodiment, the formation of the conductive gate structure is suitably accomplished by depositing polysilicon on an upper surface of the gate dielectric. A suitable method of depositing polysilicon includes thermally decomposing silane in a chemical vapor deposition reactor chamber maintained at a temperature in the range of approximately 580 to 650° C.

The present invention further includes an integrated circuit comprised of a substrate, an isolation structure and a gate dielectric. The isolation structure includes an isolation dielectric contained within an isolation trench formed within an isolation region of the semiconductor substrate. The gate dielectric is formed on an upper surface of the substrate. The substrate includes an oxygen bearing impurity distribution in regions of the substrate proximal to the isolation structure. A first thickness of the gate dielectric over regions of the proximal portions of the semiconductor substrate is greater than a second thickness of the gate dielectric over portions of the semiconductor substrate distal from the isolation structure.

The substrate preferably comprises a p-type epitaxial layer formed on a p+ silicon bulk wherein a resistivity of the epitaxial layer is in the range of approximately 10 to 15 $\Omega$-cm. The isolation dielectric is preferably comprised of a chemical vapor deposited oxide. In a preferred embodiment, the proximal portions of the semiconductor substrate are within approximately 200 angstroms of the isolation structure. In one embodiment, the gate dielectric is comprised of a thermal oxide. A first thickness of the thermal oxide is in the range of approximately 30 to 100 angstroms and a second thickness is in the range of approximately 15 to 50 angstroms.

The present invention still further contemplates a method for reducing an electric field in peripheral portions of a gate dielectric in a semiconductor manufacturing process. The method includes thermally oxidizing an upper surface of a semiconductor substrate to form a gate dielectric on the semiconductor substrate. The substrate includes an oxygen bearing impurity distribution within regions of the substrate proximal to an isolation region of the substrate to increase an oxidation rate of the substrate over the proximal region. In this manner, the gate dielectric includes a first thickness over the proximal regions and a second thickness over regions of the semiconductor substrate distal from the isolation structure. The oxygen bearing impurity distribution is preferably introduced into the semiconductor substrate by a ion implantation of an oxygen species into the substrate after forming a patterned mask wherein the patterned mask exposes the proximal portions of the substrate to the ion implantation process.

BRIEF DESCRIPTION OF THE DRAWINGS

Other objects and advantages of the invention will become apparent upon reading the following detailed description and upon reference to the accompanying drawings in which.

Figure 1:
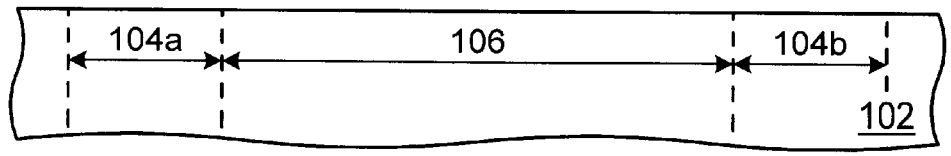
FIG. 1 is a partial cross-sectional view of a semiconductor substrate including at least one isolation region.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1 through 7 show a presently preferred sequence for fabricating the multi-thickness gate dielectric in accordance with the present invention. Turning to FIG. 1, a partial cross-sectional view of a semiconductor substrate 102 is shown. Semiconductor substrate 102 includes a pair of laterally displaced isolation regions represented in FIG. 1 by reference numerals 104a and 104b. Isolation regions 104a and 104b are laterally displaced on either side of active region 106 of semiconductor substrate 102. As their names imply, isolation regions 104a and 104b identify regions of semiconductor substrate 102 into which isolation structures as are well known in the field of semiconductor processing will be formed. Active region 106, on the other hand, indicates a portion of semiconductor substrate 102 into which transistors may be fabricated. In a preferred embodiment, semiconductor substrate 102 comprises a single crystal silicon substrate typically about 150 mm or 200 mm in diameter as is well known in the field. In one presently preferred embodiment, semiconductor substrate 102 comprises a p-type epitaxial layer formed over a p+ silicon bulk. A preferred resistivity of the p-type epitaxial layer is in the range of approximately 10 to 15 $\Omega$-cm. The p+ silicon bulk typically includes an impurity distribution of a p-type impurity such as boron wherein the peak concentration of the impurity distribution is greater than approximately $1\times10^{19}$ atoms/cm$^3$. It will be appreciated to those skilled in the art of semiconductor processing that various implant procedures may be performed at the front end of the processing sequence. More specifically, p well and n well regions may be formed in a CMOS embodiment of the present invention through the use of masking steps and ion implantation steps as are well known in the field.

Figure 2:
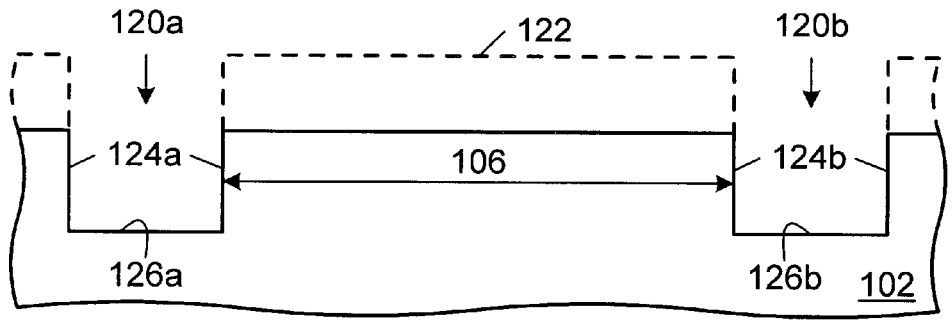
FIG. 2 is a processing step subsequent to FIG. 1 in which at least one isolation trench has been formed into the isolation region of the semiconductor substrate.

Turning now to FIG. 2, isolation trenches represented by respectively, typically numerals 120a and 120b are etched into semiconductor substrate 102. Isolation trenches 120a and 120b are etched into isolation regions 104a and 104b respectively, typically, to a depth of approximately 1000 to 3000 angstroms. Appropriate isolation trenches with substantially vertical sidewalls (represented in FIG. 2 by reference numerals 124a and 124b) may be suitably formed using a chlorine bearing plasma etch process. FIG. 2 further shows the outline of a suitable mask 122 formed prior to the etch process resulting in the selective removal of the portions of semiconductor substrate 102 exposed by the pattern mask 122. The pattern mask 122 typically comprises photoresist or other suitable masking material such as, for example, a deposited oxide.

Figure 3:
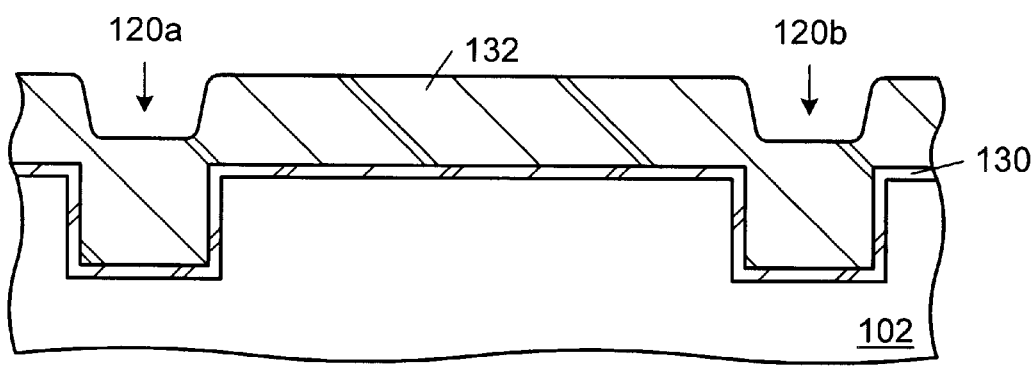
FIG. 3 is a processing step subsequent to FIG. 2 in which a thermal oxide liner has been formed and, thereafter, an isolation dielectric deposited to fill the isolation trench.

Turning now to FIG. 3, isolation trenches 120a and 120b are filled with an isolation dielectric 132. In one embodiment, the isolation dielectric comprises a deposited oxide. In one embodiment, the deposition of isolation dielectric 132 is accomplished by thermally decomposing TEOS in a plasma enhanced chemical vapor deposition reactor chamber that is maintained at a temperature in the range of approximately 650 to 750° C. In the embodiment shown in FIG. 3, an optional thermal oxidation process may be executed prior to the chemical vapor deposition of isolation dielectric 132. In such an embodiment, a thermal oxide film 130 forms a liner on the sidewalls 124 and floor 126 of isolation trenches 120a and 120b. In embodiments of the present invention employing a thermal dielectric such as thermal dielectric layer 130, an appropriate method of fabricating the thermal dielectric includes immersing semiconductor substrate 102 into an oxygen bearing ambient maintained at a temperature in the range of approximately 500 to 900° C. A suitable thickness of thermal dielectric layer 130 is preferably in the range of approximately 50 to 250 angstroms. The presence of a thermal oxide liner such as thermal dielectric layer 130 is believed to beneficially result in a higher quality finished product by providing a dielectric layer of improved quality between the semiconductor substrate 102 and the bulk trench dielectric 132.

Figure 4:
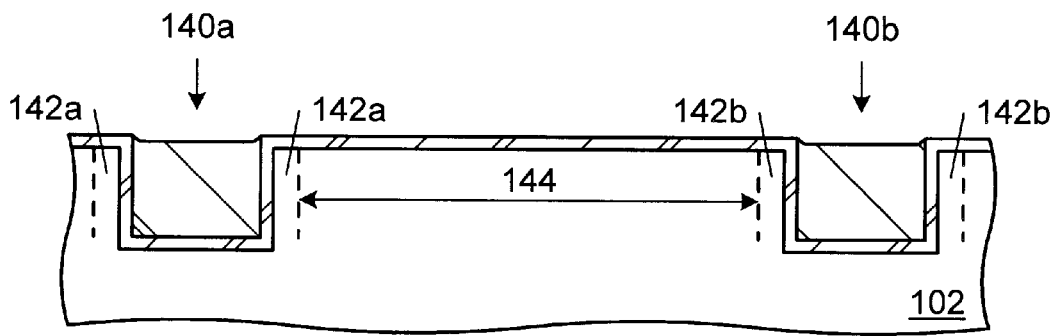
FIG. 4 is a processing step subsequent to FIG. 3 in which the isolation dielectric has been planarized to remove portions of the isolation dielectric exterior to the isolation trench.

Turning now to FIG. 4, a planarization process is performed to remove portions of isolation dielectric 132 from regions exterior to isolation trenches 120a and 120b. Suitable planarization processes include chemical mechanical polishing as well as reflow and etch back techniques as are known to those skilled in the field. The planarization of isolation dielectric 132 results in the completion of isolation structures 140a and 140b. FIG. 4 also discloses proximal portions 142a and 142b as well as distal portions 144 of semiconductor substrate 102. Proximal portions 142a of semiconductor substrate 102 include those regions of the substrate proximal to sidewalls 124a and 124b of isolation structures 140a and 140b respectively. In one embodiment, proximal portions 142a and 142b indicate those portions of semiconductor substrate 102 within approximately 200 angstroms of sidewalls 124a of isolation structure 140.

Figure 5:
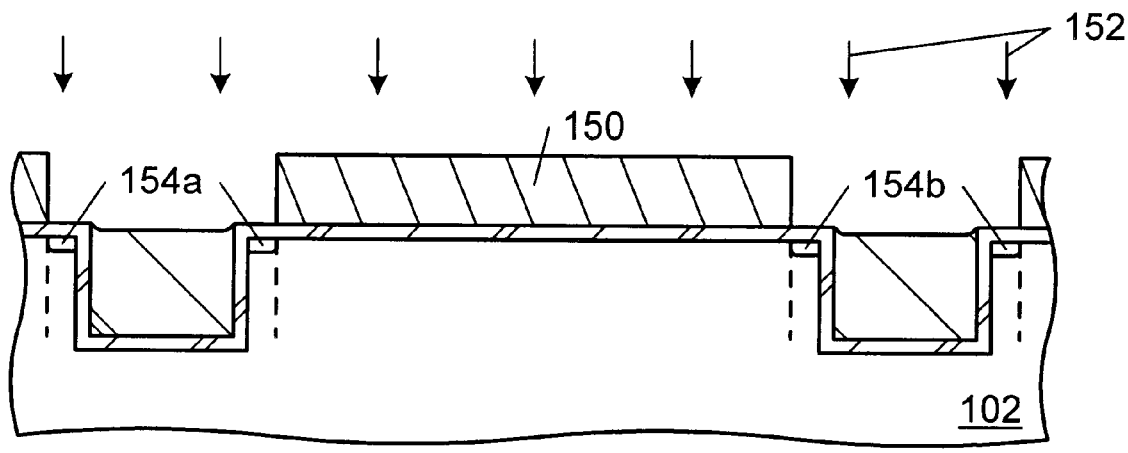
FIG. 5 is a processing step subsequent to FIG. 4 which a patterned mask has been formed exposing portions of the semiconductor substrate proximal to the isolation structure and, thereafter, an oxygen bearing species introduced into the proximal portions of the substrate.

Turning now to FIG. 5, a subsequent processing step is shown in which an oxygen bearing impurity distribution 154a is introduced into proximal portions 142 of semiconductor substrate 102. In the preferred embodiment, the introduction of oxygen bearing impurity distribution 154 is accomplished with an ion implantation process represented in FIG. 5 by reference numeral 152. As further indicated in FIG. 5, the ion implantation 152 is preferably performed after the formation of an implant mask 150 fabricated on an upper surface of semiconductor substrate 102. In the most simple embodiment, isolation mask 150 comprises a patterned photoresist layer wherein the pattern exposes proximal portions 142 of semiconductor substrate 102. Pattern mask 150 substantially prevents the oxygen species within the oxygen bearing impurity distribution from entering distal portions 144 of semiconductor substrate 102. In a presently preferred embodiment, a suitable implant energy for ion implantation process 152 is in the range of approximately 10 to 50 keV and a suitable implant dose is in the range of approximately $1\times10^{14}$ to $5\times10^{15}$ atoms/cm$^2$. Implantation process 152 preferably results in an impurity distribution 154 within semiconductor substrate 102 to increase the oxygen concentration of semiconductor substrate 102 in an effort to increase a subsequent oxidation rate in the proximal regions 142 of semiconductor substrate 102.

Figure 6:
FIG. 6 is a processing step subsequent to FIG. 5 in which the patterned mask has been removed.
Figure 7:
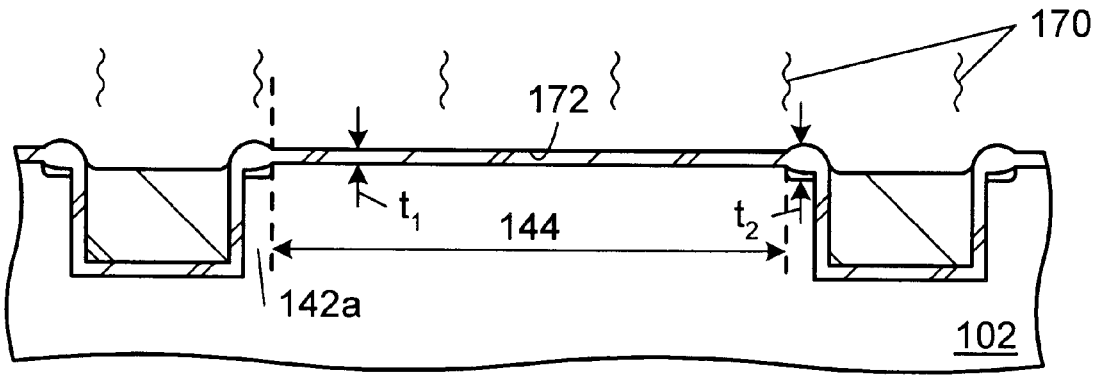
FIG. 7 is a processing step subsequent to FIG. 6 in which an upper surface of a the semiconductor substrate is thermally oxidized and wherein the presence of the oxygen bearing impurity distribution within the semiconductor substrate results in a first thickness of the gate dielectric over the proximal portions of the substrate and further results in a second thickness of the gate dielectric over distal portions of the semiconductor substrate.

Turning now to FIG. 6, the patterned mask implant mask 150 has been removed from above semiconductor substrate 102 and any remaining dielectric films residing upon substrate 102 are removed preferably through the use of a wet etch process such as an HF dip. Subsequent to the removal of any remaining dielectric film residing above semiconductor substrate 102, the semiconductor substrate surface is cleaned suitably through the use of an RCA clean procedure as is known to those skilled in the field of semiconductor processing. Subsequent to the cleaning procedure, the cross-section shown in FIG. 6 is obtained. In this figure, semiconductor substrate 102 includes oxygen bearing impurity distributions 154 located in regions proximal to isolation structures and located at the upper surface of semiconductor substrate 102. When the substrate 102 shown in FIG. 6 is subjected to an oxidation cycle as represented by reference numeral 170 shown in FIG. 7, a thermal oxide film 172 is grown upon the upper surface of the semiconductor substrate. The presence of oxygen bearing impurity distributions 154 in proximal portions 142 of semiconductor substrate 102 during thermal oxidation process 170 results in a gate dielectric film 172 which includes a first thickness $T_1$ over distal portions 144 of semiconductor substrate 102 and further results in a second gate dielectric thickness $T_2$ over proximal regions 142 of semiconductor substrate 102. In a presently preferred embodiment, the thickness $T_2$ exceeds the thickness $T_1$ by approximately 20 to 100 angstroms while the thickness $T_1$ is in the range of approximately 50 to 150 angstroms. The presence of a thicker gate dielectric proximal to the isolation structures results in a lower electric field across the proximal portions of the gate dielectric during normal device operation. The reduced electric field is believed to result in a gate dielectric film that will evidence improved reliability because the reduction in electric field occurs proximal to the geographic discontinuity of semiconductor substrate 102 at the isolation structure 140. But for the increased oxide thickness in proximal regions 142 of substrate 102, the sharp corners and geometric discontinuities occurring at the edges of the active region 106 of semiconductor substrate 102 could result in excessive electric fields across gate dielectric 172 in those regions of gate dielectric 172 over proximal portions 154 of semiconductor substrate 102.

As will be appreciated to those skilled in the art, the present invention may further include the process of fabricating a conductive gate structure on an upper surface of gate dielectric 172. Although this process step is not shown in the drawings, any suitable method of fabricating a conductive gate structure in an MOS transistor may be implemented, including, for example, the thermal decomposition of silane within a chemical vapor deposition reactor chamber maintained at a temperature in the range of approximately 580 to 650° C. In such an embodiment, the polysilicon layer deposited by the described deposition method is suitably doped with an appropriate impurity concentration to reduce a sheet resistivity of the polysilicon to less than approximately 500Ω per square. In alternative embodiments, a suitable conductive gate structure may be comprised of aluminum, copper, tungsten, or other suitable conductive material. After the blanket deposition of the appropriate material for the conductive gate structure, a photolithography/etch sequence is typically implemented to complete the formation of the conductive gate structures.

It will be appreciated to those skilled in the art that the present invention contemplates a useful method of reducing the electric field at the isolation edges of an active region of a semiconductor substrate. This reduction in an electric field occurs proximal to sharp discontinuities in the underlying semiconductor substrate where electric fields tend to be greatest. By reducing the electric field in these regions, it is believed that a more reliable device is possible. Although specific embodiments of the present inventions have been shown and described with respect to the figures, it will be appreciated that changes will be made to each of the processing steps as would be evident to a person skilled in the field of semiconductor processing without significantly altering the scope of the present invention. Accordingly, the following claims are intended to be interpreted broadly to include all such modifications and changes.

What is claimed is:

1. A semiconductor process, comprising:

providing a semiconductor substrate;

forming at least one isolation structure in said semiconductor substrate;

introducing an oxygen bearing species into portions of said semiconductor substrate proximal to said isolation structure; and forming a gate dielectric layer on an upper surface of said semiconductor substrate, wherein the presence of said oxygen bearing species in said proximal portions of said semiconductor substrate increases an oxidation rate of said portions relative to an oxidation rate of portions of said semiconductor substrate distal to said isolation structure, whereby a first thickness of said gate dielectric layer over said proximal portions of said semiconductor substrate is greater than a second thickness of said gate oxide layer over said distal portions of said semiconductor substrate.

2. The process of claim 1, wherein said semiconductor substrate comprises a single crystal silicon wafer including a p-type epitaxial layer formed on a p+ silicon bulk, wherein a resistivity of said epitaxial layer is in the range of approximately 10 to 15 $\Omega$-cm.

3. The process of claim 1, wherein the step of forming said isolation structure comprises;

etching an isolation trench into an isolation region of said semiconductor substrate;

filling said isolation trench with an isolation dielectric; and removing portions of said isolation dielectric exterior to said isolation trench.

4. The process of claim 3, wherein the step of filling said isolation trench comprises thermally decomposing TEOS in a plasma enhanced chemical vapor deposition reactor chamber maintained at a temperature in the range of approximately 650 to 750° C.

5. The process of claim 4, further comprising, prior to the step of thermally decomposing said TEOS, forming a thermal oxide layer on exposed surfaces of said isolation trench by immersing said semiconductor substrate in an oxygen bearing ambient maintained at a temperature in the range of approximately 500 to 900° C.

6. The process of claim 3, wherein the step of removing portions of said isolation dielectric comprises planarizing said isolation dielectric with a chemical mechanical polish.

7. The process of claim 1, wherein the step of introducing said oxygen bearing species comprises:

forming a patterned mask over an upper surface of said semiconductor substrate, wherein said patterned mask exposes regions of said semiconductor substrate proximal to said isolation structure; and implanting said oxygen species into said semiconductor substrate, wherein said patterned mask substantially prevents said oxygen species from entering distal portions of said semiconductor substrate.

8. The process of claim 7, wherein an implant energy for said ion implantation is in the range of approximately 10 to 50 keV.

9. The process of claim 7, wherein an implant dose for said ion implanting is in the range of approximately $1 \times 10^{15}$ to $5 \times 10^{15}$ atoms/cm$^2$.

10. The process of claim 1, wherein said proximal portions of said semiconductor substrate comprise portions of said semiconductor substrate within approximately 200 angstroms of said isolation structure.

11. The process of claim 1, further comprising forming a conductive gate structure on an upper surface of said semiconductor substrate.

12. The process of claim 11, wherein the step of forming said conductive gate structure comprises depositing polysilicon on an upper surface of said gate dielectric layer by thermally decomposing silane in a chemical vapor deposition reactor chamber maintained at a temperature in the range of approximately 580 to 650° C.

13. In a semiconductor manufacturing process, a method for reducing an electric field in peripheral portions of a gate dielectric, said method comprising thermally oxidizing an upper surface of a semiconductor substrate to form a gate dielectric on said semiconductor substrate, wherein said substrate includes an oxygen bearing impurity distribution within regions of said semiconductor substrate proximal to an isolation structure of said substrate to increase an oxidation rate of said semiconductor substrate over said proximal region whereby said gate dielectric includes a first thickness over said proximal regions and a second thickness over regions of said semiconductor substrate distal from said isolation structure.

14. The process of claim 13, wherein said oxygen bearing impurity distribution is introduced into said semiconductor substrate by ion implanting an oxygen species into said semiconductor substrate in the presence of a patterned mask, said patterned mask exposing said proximal portions of said semiconductor substrate.

15. A method for forming a semiconductor device, comprising:

forming a pair of isolation structures within isolation regions of a semiconductor substrate, wherein the isolation structures are substantially filled by an insulating material, and wherein the isolation structures are separated by an active region of the semiconductor substrate, wherein an upper surface of the active region comprises an uppermost surface of the semiconductor substrate;

introducing an oxygen-bearing species into portions of the active region laterally adjacent and proximal to the isolation structures; and forming a gate dielectric having non-uniform thickness upon the upper surface of the active region, wherein a first thickness of the gate dielectric, formed upon proximal portions of the active region containing the oxygen-bearing species, is larger than a second thickness of the gate dielectric, formed upon a portion of the active region laterally disposed between the proximal portions of the active region.

16. The method as recited in claim 15, wherein said forming the pair of isolation structures further comprises:

etching a pair of isolation trenches into the isolation regions of the semiconductor substrate;

filling the isolation trenches with an isolation dielectric; and removing portions of the isolation dielectric external to the isolation trenches.

17. The method as recited in claim 16, further comprising forming a thermal oxide layer on exposed surfaces of each of the isolation trenches by immersing the semiconductor substrate in an oxygen-bearing ambient maintained at a temperature in the range of approximately 500° C. to 900° C., prior to said filling the isolation trenches.

18. The method as recited in claim 16, wherein said removing portions comprises planarizing the isolation dielectric with a chemical-mechanical polish.

19. The method as recited in claim 15, wherein said introducing the oxygen-bearing species comprises:

forming a patterned mask over a central portion of the active region of the semiconductor substrate, wherein the patterned mask exposes portions of the active region proximal to the isolation structures; and implanting the oxygen-bearing species into the exposed active region portions.

20. The method as recited in claim 15, wherein said introducing the oxygen-bearing species comprises introducing the species into portions of the active region within approximately 200 angstroms of one of the isolation structures.

* * * * *